United States Patent
Hsu et al.

(10) Patent No.: US 11,726,159 B2
(45) Date of Patent: Aug. 15, 2023

(54) B0 AND B1 CORRECTION ANTI-RESPECTIVELY

(71) Applicant: Siemens Healthcare GmbH, Erlangen (DE)

(72) Inventors: Yi-Cheng Hsu, Taipei (TW); Patrick Liebig, Erlangen (DE)

(73) Assignee: Siemens Healthcare GmbH, Erlangen (DE)

(*) Notice: Subject to any disclaimer, the term of this patent is extended or adjusted under 35 U.S.C. 154(b) by 233 days.

(21) Appl. No.: 17/343,014

(22) Filed: Jun. 9, 2021

(65) Prior Publication Data

US 2021/0389404 A1 Dec. 16, 2021

(30) Foreign Application Priority Data

Jun. 10, 2020 (CN) .......................... 202010526773.9

(51) Int. Cl.
*G01R 33/565* (2006.01)
*G06T 5/50* (2006.01)
*G01R 33/485* (2006.01)

(52) U.S. Cl.
CPC ..... *G01R 33/56527* (2013.01); *G01R 33/485* (2013.01); *G06T 5/50* (2013.01); *G06T 2207/10088* (2013.01); *G06T 2207/30016* (2013.01)

(58) Field of Classification Search
CPC ........... G01R 33/56527; G01R 33/485; G01R 33/56563; G01R 33/5659; G01R 33/5605; G01R 33/58; G06T 5/50; G06T 2207/10088; G06T 2207/30016; G06T 2207/10016
See application file for complete search history.

(56) References Cited

U.S. PATENT DOCUMENTS 11,307,271 B2 * 4/2022 De Weerdt ......... G01R 33/4828

OTHER PUBLICATIONS

Phillip Zhe Sun et al., Correction for Artifacts Induced by B0 and B1 Field Inhomogeneities in pH-Sensitive Chemical Exchange Saturation Transfer (CEST) Imaging (Year: 2007).*

* cited by examiner

*Primary Examiner* — Mekonen T Bekele
(74) *Attorney, Agent, or Firm* — Banner & Witcoff Ltd.

(57) ABSTRACT

The disclosure relates to techniques for perming chemical exchange saturation transfer (CEST) imaging correction. The present disclosure improves the speed of correcting CEST images.

11 Claims, 14 Drawing Sheets

B0 AND B1 CORRECTION ANTI-RESPECTIVELY

CROSS-REFERENCE TO RELATED APPLICATIONS

The present application claims the benefit of the filing date of China patent application no. CN 202010526773.9, filed on Jun. 10, 2020, the contents of which are incorporated herein by reference in their entirety.

TECHNICAL FIELD

The disclosure relates to the technical field of magnetic resonance imaging (MRI), in particular to a Chemical Exchange Saturation Transfer (CEST) imaging correction method, device, and a computer-readable storage medium.

BACKGROUND

MRI involves the exertion of radio frequency (RF) pulses having a specific frequency on a human body in a magnetostatic field so that hydrogen protons in the human body are excited to cause a magnetic resonance phenomenon; after the emission of pulses is stopped, protons produce magnetic resonance (MR) signals during the relaxation process; MR images are produced after the processes of the receiving of MR signals, space encoding and image reconstruction.

With the development of MRI technology, CEST has become a hot topic in the MRI field. CEST is used for the imaging of solute molecules whose concentration is a plurality of magnitudes less than that of water molecules and which are free in water. Compared with hydrogen nuclei in water molecules, since hydrogen nuclei in the solute molecules are in different chemical environments, a tiny magnetic resonance frequency shift will be caused, even if in the same external magnetic field. This shift is called a chemical shift. In CEST research, solute molecules form a set and are called a solute pool, while free water molecules are called a water pool. When a pre-saturated RF pulse is exerted on the resonance frequency of the solute pool, hydrogen protons in the solute pool are saturated, and then a chemical exchange happens between the two pools. As a result, saturated hydrogen protons in the solute pool are transferred to the water pool to replace unsaturated hydrogen protons in the water pool. After a period of time of accumulations, collected signals in the water pool will produce an extra attenuation at the time of imaging. From the attenuated signals, many important physiological parameters can be estimated.

In a practical CEST imaging experiment, a pre-saturated RF pulse is exerted not only on the resonance frequency of the solute pool, but is instead exerted over many frequency points on a frequency axis in a certain range. An MRI signal of the water pool is collected at each frequency point after saturation. In view of the existence of the CEST mechanism, the MRI signal has a significant attenuation compared with the signal on which the pre-saturated pulse is not exerted. The information of the CEST contrast agent is quantitatively analyzed according to the attenuation, and then important physiochemical parameters or structural information relating to an imaging area is obtained.

To apply CEST imaging clinically, the space coverage ratio and the MR signal acquisition speed must satisfy certain conditions. In addition, it is also required that the final CEST image should have no ghost.

The B1 field represents the intensity of an RF pulse when a magnetic resonance coil emits the RF pulse. Because of a high dielectric constant of the tissue and the non-uniformity of the emitting field of the coil, the RF B1 field is non-uniform in space. As the magnetic field intensity of a current magnetic resonance spectrometer increases, the non-uniformity of the RF B1 field worsens. In current common MRI methods, such as parallel imaging and CEST imaging, image reconstruction and correction are required for the distribution of the RF B1 field.

The B0 field represents the induced magnetic field intensity at a point in space during MRI and is closely related to the nucleus spinning frequency. The offset frequency of the B0 field is used to represent the difference between the RF frequency and the nucleus spinning frequency at the time of RF excitation. A B0 field offset will influence the measurement of the distribution of the B1 field. Especially when the B0 field offset is large, magnetic resonance signals are related to B0 and B1 under the off-resonance effect.

Because of the non-uniformity of the B1 field and the B0 field, a saturation frequency and intensity have spatial dependency. This hinders the estimation of reliability and reproducibility. The correction of the B0 field and B1 field of each imaging voxel is very important to the uniformity of the CEST contrast of a whole imaging area.

SUMMARY

To solve the above-mentioned problems, the present disclosure provides a CEST imaging correction method to improve the robustness and speed of a CEST imaging correction;

the present disclosure further provides a CEST imaging correction device to improve the robustness and speed of a CEST imaging correction;

the present disclosure further provides a computer-readable storage medium to improve the robustness and speed of a CEST imaging correction.

To achieve the above-mentioned objects, the present disclosure provides the following technical solutions:

A CEST imaging correction method comprises:

collecting a plurality of CEST images in an imaging area;

for each pixel point in each CEST image, calculating the corresponding real saturation frequency of the pixel point according to the predetermined frequency deviation of the water resonance frequency of the corresponding voxel of the pixel point relative to the corresponding water resonance frequency of the main magnetic field and the frequency of the pre-saturated RF pulse used for collecting the CEST image, and calculating the corresponding real saturation B1 field intensity of the pixel point according to the predetermined conversion coefficient between the real saturation B1 field intensity of the corresponding voxel of the pixel point and the system B1 field intensity and the intensity of the pre-saturated RF pulse used for collecting the CEST image, wherein the system B1 field intensity is equal to the intensity of the pre-saturated RF pulse used for collecting the CEST image;

for pixel points corresponding to the same voxel in an imaging area in all CEST images, comparing the corresponding real saturation frequency and real saturation B1 field intensity of each pixel point with the target saturation frequency and target saturation B1 field intensity, respectively, selecting a plurality of pixel points as interpolated pixel points according to the comparison results, and performing interpolation calculations for the pixel values of the selected interpolated pixel points in the CEST images to obtain the pixel value of the corresponding voxel with the target saturation frequency and target saturation B1 field intensity.

Calculating the corresponding real saturation frequency of the pixel point comprises calculating the corresponding real saturation frequency of the pixel point according to the following formula:

$$f_{real}(m,n)=f(m)-\gamma\Delta B0(n)$$

wherein f(m) is the frequency of the pre-saturated RF pulse used for collecting the $m^{th}$ CEST image, $\gamma$ is the gyromagnetic ratio of a spinning nucleus, $\Delta B0(n)$ is the magnetic field deviation of the corresponding voxel of the $n^{th}$ pixel point in each CEST image relative to the main magnetic field, $\gamma\Delta B0(n)$ is the frequency deviation of the corresponding water resonance frequency of the corresponding voxel of the $n^{th}$ pixel point in each CEST image relative to the main magnetic field, $f_{real}(m,n)$ is the corresponding real saturation frequency of the $n^{th}$ pixel point in the $m^{th}$ CEST image, n and m are positive integers, $1 \le m \le M$, $1 \le n \le N$, M is the total number of times CEST images are collected, and N is the total number of pixel points in each CEST image.

Calculating the corresponding real saturation B1 field intensity of the pixel point comprises calculating the corresponding real saturation B1 field intensity of the pixel point according to the following formula:

$$B1_{real}(m,n)=B1(m)*B1map(n)$$

wherein B1(m) is the intensity of the pre-saturated RF pulse used for collecting the $m^{th}$ CEST image, B1map(n) is the conversion coefficient between the corresponding real saturation B1 field intensity of the $n^{th}$ pixel point in the $m^{th}$ CEST image and the system B1 field intensity, the system B1 field intensity is the intensity of the pre-saturated RF pulse used for collecting the $m^{th}$ CEST image, $B1_{real}(m,n)$ is the corresponding real saturation intensity of the $n^{th}$ pixel point in the $m^{th}$ CEST image, m and n are positive integers, $1 \le m \le M$, $1 \le n \le N$, M is the total number of times CEST images are collected, and N is the total number of pixel points in each CEST image.

For the pixel points corresponding to the same voxel in an imaging area in all CEST images, comparing the corresponding real saturation frequency and real saturation B1 field intensity of each pixel point with the target saturation frequency and target saturation B1 field intensity, respectively, and selecting a plurality of pixel points as interpolated pixel points according to the comparison results comprises:

pre-establishing a 2-dimensional coordinate system, with the X-axis representing $f_{real}$ and the Y-axis representing $B1_{real}$;

denoting the $n^{th}$ pixel point in all CEST images as $(f_{real}(m,n), B1_{real}(m,n))$ respectively in the coordinate system, meanwhile denoting $(f_{target}, B1_{target})$ in the coordinate system (in this case, there are M+1 points in the coordinate system), and then finding P points which are the closest to $(f_{target}, B1_{target})$ but are not in a line from M points $(f_{real}(m,n), B1_{real}(m,n))$, wherein the value of P is determined by a preset interpolation algorithm, wherein $f_{real}(m,n)$ is the corresponding real saturation frequency of the $n^{th}$ pixel point in the $m^{th}$ CEST image, $B1_{real}(m,n)$ is the corresponding real saturation intensity of the $n^{th}$ pixel point in the $m^{th}$ CEST image, $f_{target}$ is the target saturation frequency, $B1_{target}$ is the target saturation B1 field intensity, m and n are positive integers, $1 \le m \le M$, $1 \le n \le N$, M is the total number of times CEST images are collected, and N is the total number of pixel points in each CEST image.

For the pixel points corresponding to the same voxel in an imaging area in all CEST images, comparing the corresponding real saturation frequency and real saturation B1 field intensity of each pixel point with the target saturation frequency and target saturation B1 field intensity, respectively, and selecting a plurality of pixel points as interpolated pixel points according to the comparison results comprises:

pre-establishing a 2-dimensional coordinate system, with the X-axis representing $f_{real}$ and the Y-axis representing $B1_{real}$;

denoting the $n^{th}$ pixel point in all CEST images as $(f_{real}(m,n), B1_{real}(m,n))$ respectively in the coordinate system, and meanwhile denoting $(f_{target}, B1_{target})$ in the coordinate system (in this case, there are M+1 points in the coordinate system);

for each pixel point $(f_{real}(m,n), B1_{real}(m,n))$, letting the pixel point and every other P−1 pixel points form a polygon of P sides according to the 2-dimensional coordinates $(f_{real}(m,n), B1_{real}(m,n))$;

finding the polygon of P sides which is the closest to $(f_{target}, B1_{target})$ and using P vertexes of the polygon of P sides as interpolated pixel points;

wherein $f_{real}(m,n)$ is the corresponding real saturation frequency of the $n^{th}$ pixel point in the $m^{th}$ CEST image, $B1_{real}(m,n)$ is the corresponding real saturation intensity of the $n^{th}$ pixel point in the $m^{th}$ CEST image, $f_{target}$ is the target saturation frequency, $B1_{target}$ is the target saturation B1 field intensity, m and n are positive integers, $1 \le m \le M$, $1 \le n \le N$, M is the total number of times CEST images are collected, N is the total number of pixel points in each CEST image, and the value of P is determined by a preset interpolation algorithm.

A CEST imaging correction device comprises:

a real saturation frequency and intensity calculation module (processors, processing circuitry, processors executing machine readable instructions, etc.), configured, for each pixel point in each CEST image, to calculate the corresponding real saturation frequency of the pixel point according to the predetermined frequency deviation of the water resonance frequency of the corresponding voxel of the pixel point relative to the corresponding water resonance frequency of the main magnetic field and the frequency of the pre-saturated RF pulse used for collecting the CEST image, and calculate the corresponding real saturation B1 field intensity of the pixel point according to the predetermined conversion coefficient between the real saturation B1 field intensity of the corresponding voxel of the pixel point and the system B1 field intensity and the intensity of the pre-saturated RF pulse used for collecting the CEST image when a plurality of CEST images in an imaging area are collected, wherein the system B1 field intensity is equal to the intensity of the pre-saturated RF pulse used for collecting the CEST image;

an interpolation module (processors, processing circuitry, processors executing machine readable instructions, etc.), configured, for pixel points corresponding to the same voxel in an imaging area in all CEST images, to compare the corresponding real saturation frequency and real saturation B1 field intensity of each pixel point with the target saturation frequency and target saturation B1 field intensity, respectively, select a plurality of pixel points as interpolated pixel points according to the comparison results, and perform interpolation calculations for the pixel values of the selected interpolated pixel points in the CEST images to obtain the pixel value of the corresponding voxel with the target saturation frequency and target saturation B1 field intensity.

The real saturation frequency and intensity calculation module calculating the real saturation frequency of the pixel point comprises calculating the real saturation frequency of the pixel point according to the following formula:

$$f_{real}(m,n) = f(m) - \gamma \Delta B0(n)$$

wherein f(m) is the frequency of the pre-saturated RF pulse used for collecting the $m^{th}$ CEST image, $\gamma$ is the gyromagnetic ratio of a spinning nucleus, $\Delta B0(n)$ is the magnetic field deviation of the corresponding voxel of the $n^{th}$ pixel point in each CEST image relative to the main magnetic field, $\gamma \Delta B0(n)$ is the frequency deviation of the corresponding water resonance frequency of the corresponding voxel of the $n^{th}$ pixel point in each CEST image relative to the main magnetic field, $f_{real}(m,n)$ is the corresponding real saturation frequency of the $n^{th}$ pixel point in the $m^{th}$ CEST image, n and m are positive integers, $1 \leq m \leq M$, $1 \leq n \leq N$, M is the total number of times CEST images are collected, and N is the total number of pixel points in each CEST image.

The real saturation frequency and intensity calculation module calculating the real saturation B1 field intensity of the pixel point comprises calculating the real saturation B1 field intensity of the pixel point according to the following formula:

$$B1_{real}(m,n) = B1(m) * B1map(n)$$

wherein B1(m) is the intensity of the pre-saturated RF pulse used for collecting the $m^{th}$ CEST image, B1map(n) is the conversion coefficient between the corresponding real saturation B1 field intensity of the $n^{th}$ pixel point in the $m^{th}$ CEST image and the system B1 field intensity, the system B1 field intensity is the intensity of the pre-saturated RF pulse used for collecting the $m^{th}$ CEST image, $B1_{real}(m,n)$ is the corresponding real saturation intensity of the $n^{th}$ pixel point in the $m^{th}$ CEST image, m and n are positive integers, $1 \leq m \leq M$, $1 \leq n \leq N$, M is the total number of times CEST images are collected, and N is the total number of pixel points in each CEST image.

For the pixel points corresponding to the same voxel in an imaging area in all CEST images, the interpolation module comparing the corresponding real saturation frequency and real saturation B1 field intensity of each pixel point with the target saturation frequency and target saturation B1 field intensity, respectively, and selecting a plurality of pixel points as interpolated pixel points according to the comparison results comprises:

pre-establishing a 2-dimensional coordinate system, with the X-axis representing $f_{real}$ and the Y-axis representing $B1_{real}$;

denoting the $n^{th}$ pixel point in all CEST images as ($f_{real}(m,n)$, $B1_{real}(m,n)$) respectively in the coordinate system, meanwhile denoting ($f_{target}$, $B1_{target}$) in the coordinate system (in this case, there are M+1 points in the coordinate system), and then finding P points which are the closest to ($f_{target}$, $B1_{target}$) but are not in a line from M pixel points ($f_{real}(m,n)$, $B1_{real}(m,n)$), wherein the value of P is determined by a preset interpolation algorithm, wherein, $f_{real}(m,n)$ is the corresponding real saturation frequency of the $n^{th}$ pixel point in the $m^{th}$ CEST image, $B1_{real}(m,n)$ is the corresponding real saturation intensity of the $n^{th}$ pixel point in the $m^{th}$ CEST image, $f_{target}$ is the target saturation frequency, $B1_{target}$ is the target saturation B1 field intensity, m and n are positive integers, $1 \leq m \leq M$, $1 \leq n \leq N$, M is the total number of times CEST images are collected, and N is the total number of pixel points in each CEST image.

For the pixel points corresponding to the same voxel in an imaging area in all CEST images, the interpolation module comparing the corresponding real saturation frequency and real saturation B1 field intensity of each pixel point with the target saturation frequency and target saturation B1 field intensity, respectively, and selecting a plurality of pixel points as interpolated pixel points according to the comparison results comprises:

pre-establishing a 2-dimensional coordinate system, with the X-axis representing $f_{real}$ and the Y-axis representing $B1_{real}$;

denoting the $n^{th}$ pixel point in all CEST images as ($f_{real}(m,n)$, $B1_{real}(m,n)$) respectively in the coordinate system, and meanwhile denoting ($f_{target}$, $B1_{target}$) in the coordinate system (in this case, there are M+1 points in the coordinate system);

for each pixel point ($f_{real}(m,n)$, $B1_{real}(m,n)$), letting the pixel point and every other P−1 pixel points form a polygon of P sides according to the 2-dimensional coordinates ($f_{real}(m,n)$, $B1_{real}(m,n)$);

finding the polygon of P sides which is the closest to ($f_{target}$, $B1_{target}$) and using P vertexes of the polygon of P sides as interpolated pixel points;

wherein $f_{real}(m,n)$ is the corresponding real saturation frequency of the $n^{th}$ pixel point in the $m^{th}$ CEST image, $B1_{real}(m,n)$ is the corresponding real saturation intensity of the $n^{th}$ pixel point in the $m^{th}$ CEST image, $f_{target}$ is the target saturation frequency, $B1_{target}$ is the target saturation B1 field intensity, m and n are positive integers, $1 \leq m \leq M$, $1 \leq n \leq N$, M is the total number of times CEST images are collected, N is the total number of pixel points in each CEST image, and the value of P is determined by a preset interpolation algorithm.

A computer-readable storage medium stores a computer program and the computer program performs the steps of any of the above-mentioned CEST imaging correction methods when executed by one or more processors, processing circuitry, etc.

A CEST imaging correction device comprises at least one processor and a memory;

an application, which can be executed by the at least one processor to enable the at least one processor to perform the steps of the above-mentioned CEST imaging method, is stored in the memory.

In the present disclosure, for the pixel points corresponding to the same voxel in an imaging area in all CEST images, the corresponding real saturation frequency of each pixel point is compared with the target saturation frequency, the corresponding real saturation B1 field intensity of each pixel point is compared with the target saturation B1 field intensity, and a plurality of pixel points are selected as interpolated pixel points according to the comparison results. Thus, only one interpolation calculation is required for the same voxel in the imaging area to obtain the pixel value of the voxel with the target saturation frequency and target saturation B1 field intensity, and only one interpolation calculation is required to complete the correction of the B0 field and B1 field for the same voxel. With the robustness of CEST imaging correction guaranteed, the correction speed and the sampling efficiency are improved.

BRIEF DESCRIPTION OF THE DRAWINGS/FIGURES

DESCRIPTION OF REFERENCE NUMERALS IN THE DRAWINGS

Figure 1:
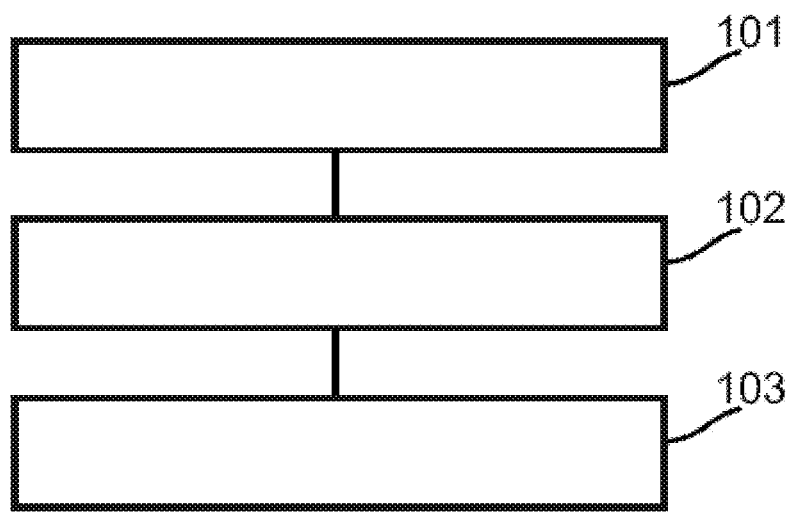
FIG. 1 illustrates a flowchart of a CEST imaging correction method in one embodiment of the present disclosure.

| Reference numeral | Meaning |
| --- | --- |
| 101-103 | Step |
| 201-208 | Step |
| 140 | CEST imaging correction device in one embodiment of the present disclosure |
| 141 | Real saturation frequency and intensity calculation module |
| 142 | Interpolation module |
| 150 | CEST imaging correction device in another embodiment of the present disclosure |
| 151 | Processor |
| 152 | Memory |
| 101-103 | Step |
| 201-208 | Step |
| 140 | CEST imaging correction device in one embodiment of the present disclosure |
| 141 | Real saturation frequency and intensity calculation module |
| 142 | Interpolation module |
| 150 | CEST imaging correction device in another embodiment of the present disclosure |
| 151 | Processor |
| 152 | Memory |

DETAILED DESCRIPTION

To make clearer the objects, technical solutions, and advantages of the present disclosure, the following further describes in detail the present disclosure in combination with the drawings and embodiments.

FIG. 1 illustrates a flowchart of a CEST imaging correction method in one embodiment of the present disclosure and the method comprises the following steps:

Step 101: Collect a plurality of CEST images in an imaging area.

Step 102: For each pixel point in each CEST image, calculate the corresponding real saturation frequency of the pixel point according to the predetermined frequency deviation of the water resonance frequency of the corresponding voxel of the pixel point relative to the corresponding water resonance frequency of the main magnetic field and the frequency of the pre-saturated RF pulse used for collecting the CEST image, and calculate the corresponding real saturation B1 field intensity of the pixel point according to the predetermined conversion coefficient between the real saturation B1 field intensity of the corresponding voxel of the pixel point and the system B1 field intensity and the intensity of the pre-saturated RF pulse used for collecting the CEST image, wherein the system B1 field intensity is equal to the intensity of the pre-saturated RF pulse used for collecting the CEST image.

The real saturation frequency is the saturation frequency relative to the water resonance frequency.

In one optional embodiment, calculating the corresponding real saturation frequency of the pixel point comprises calculating the corresponding real saturation frequency of the pixel point according to the following formula:

$$f_{real}(m,n) = f(m) - \gamma \Delta B0(n)$$

wherein $f(m)$ is the frequency of the pre-saturated RF pulse used for collecting the $m^{th}$ CEST image, $\gamma$ is the gyromagnetic ratio of a spinning nucleus, $\Delta B0(n)$ is the magnetic field deviation of the corresponding voxel of the $n^{th}$ pixel point in each CEST image relative to the main magnetic field, $\gamma \Delta B0(n)$ is the frequency deviation of the corresponding water resonance frequency of the corresponding voxel of the $n^{th}$ pixel point in each CEST image relative to the main magnetic field, $f_{real}(m,n)$ is the corresponding real saturation frequency of the $n^{th}$ pixel point in the $m^{th}$ CEST image, n and m are positive integers, $1 \leq m \leq M$, $1 \leq n \leq N$, M is the total number of times CEST images are collected, and N is the total number of pixel points in each CEST image.

In one optional embodiment, calculating the corresponding real saturation B1 field intensity of the pixel point comprises calculating the corresponding real saturation B1 field intensity of the pixel point according to the following formula:

$$B1_{real}(m,n) = B1(m) * B1map(n)$$

wherein $B1(m)$ is the intensity of the pre-saturated RF pulse used for collecting the $m^{th}$ CEST image, $B1map(n)$ is the conversion coefficient between the corresponding real saturation B1 field intensity of the $n^{th}$ pixel point in the $m^{th}$ CEST image and the system B1 field intensity, the system B1 field intensity is the intensity of the pre-saturated RF pulse used for collecting the $m^{th}$ CEST image, $B1_{real}(m,n)$ is the corresponding real saturation intensity of the $n^{th}$ pixel point in the $m^{th}$ CEST image, m and n are positive integers, $1 \leq m \leq M$, $1 \leq n \leq N$, M is the total number of times CEST images are collected, and N is the total number of pixel points in each CEST image.

Step 103: For pixel points corresponding to the same voxel in an imaging area in all CEST images, comparing the corresponding real saturation frequency and real saturation B1 field intensity of each pixel point with the target saturation frequency and target saturation B1 field intensity, respectively, selecting a plurality of pixel points as interpolated pixel points according to the comparison results, and performing interpolation calculations for the pixel values of the selected interpolated pixel points in the CEST images to obtain the pixel value of the corresponding voxel with the target saturation frequency and target saturation B1 field intensity. In other words, and as an example, for each pixel, a value may be interpolated from the selected (or all) CEST images to approximate the value of the same voxel of the CEST image having both the target saturation frequency and the target saturation b1 field intensity.

In one optional embodiment, for the pixel points corresponding to the same voxel in an imaging area in all CEST images, comparing the corresponding real saturation frequency and real saturation B1 field intensity of each pixel point with the target saturation frequency and target saturation B1 field intensity, respectively, and selecting a plurality of pixel points as interpolated pixel points according to the comparison results comprises:

Step 1031: Pre-establish a 2-dimensional coordinate system, with the X-axis representing $f_{real}$ and the Y-axis representing $B1_{real}$.

Step 1032: Denote the $n^{th}$ pixel point in all CEST images as $(f_{real}(m,n), B1_{real}(m,n))$ respectively in the coordinate system, meanwhile denoting $(f_{target}, B1_{target})$ in the coordinate system (in this case, there are M+1 points in the coordinate system), and then finding P points which are the closest to $(f_{target}, B1_{target})$ but are not in a line from M pixel points $(f_{real}(m,n), B1_{real}(m,n))$, wherein the value of P is determined by a preset interpolation algorithm, wherein $f_{real}(m,n)$ is the corresponding real saturation frequency of the $n^{th}$ pixel point in the $m^{th}$ CEST image, $B1_{real}(m,n)$ is the corresponding real saturation intensity of the $n^{th}$ pixel point in the $m^{th}$ CEST image, $f_{target}$ is the target saturation frequency, $B1_{target}$ is the target saturation B1 field intensity, m and n are positive integers, $1 \leq m \leq M$, $1 \leq n \leq N$, M is the total number of times CEST images are collected, and N is the total number of pixel points in each CEST image.

Alternatively, in one optional embodiment, for the pixel points corresponding to the same voxel in an imaging area in all CEST images, comparing the corresponding real saturation frequency and real saturation B1 field intensity of each pixel point with the target saturation frequency and target saturation B1 field intensity, respectively, and selecting a plurality of pixel points as interpolated pixel points according to the comparison results comprises:

Step 1033: Pre-establish a 2-dimensional coordinate system, with the X-axis representing $f_{real}$ and the Y-axis representing B Leal.

Step 1034: Denote the $n^{th}$ pixel point in all CEST images as $(f_{real}(m,n), B1_{real}(m,n))$ respectively in the coordinate system, and meanwhile denoting $(f_{target}, B1_{target})$ in the coordinate system (in this case, there are M+1 points in the coordinate system).

Step 1035: For each pixel point $(f_{real}(m,n), B1_{real}(m,n))$, let the pixel point and every other P−1 pixel points form a polygon of P sides according to the 2-dimensional coordinates $(f_{real}(m,n), B1_{real}(m,n))$.

Step 1036: Find the polygon of P sides which is the closest to $(f_{target}, B1_{target})$ and using P vertexes of the polygon of P sides as interpolated pixel points, wherein $f_{real}(m,n)$ is the corresponding real saturation frequency of the $n^{th}$ pixel point in the $m^{th}$ CEST image, $B1_{real}(m,n)$ is the corresponding real saturation intensity of the $n^{th}$ pixel point in the $m^{th}$ CEST image, $f_{target}$ is the target saturation frequency, $B1_{target}$ is the target saturation B1 field intensity, m and n are positive integers, $1 \leq m \leq M$, $1 \leq n \leq N$, M is the total number of times CEST images are collected, N is the total number of pixel points in each CEST image, and the value of P is determined by a preset interpolation algorithm.

In the above-mentioned embodiment, for the pixel points corresponding to the same voxel in an imaging area in all CEST images, the corresponding real saturation frequency of each pixel point is compared with the target saturation frequency, the corresponding real saturation B1 field intensity of each pixel point is compared with the target saturation B1 field intensity, and a plurality of pixel points are selected as interpolated pixel points according to the comparison results. Thus, only one interpolation calculation is required for the same voxel in the imaging area to obtain the pixel value of the voxel with the target saturation frequency and target saturation B1 field intensity, and only one interpolation calculation is required to complete the correction of the B0 field and B1 field for the same voxel. The CEST imaging correction speed and robustness, and the sampling efficiency of CEST imaging are improved.

Figure 2:
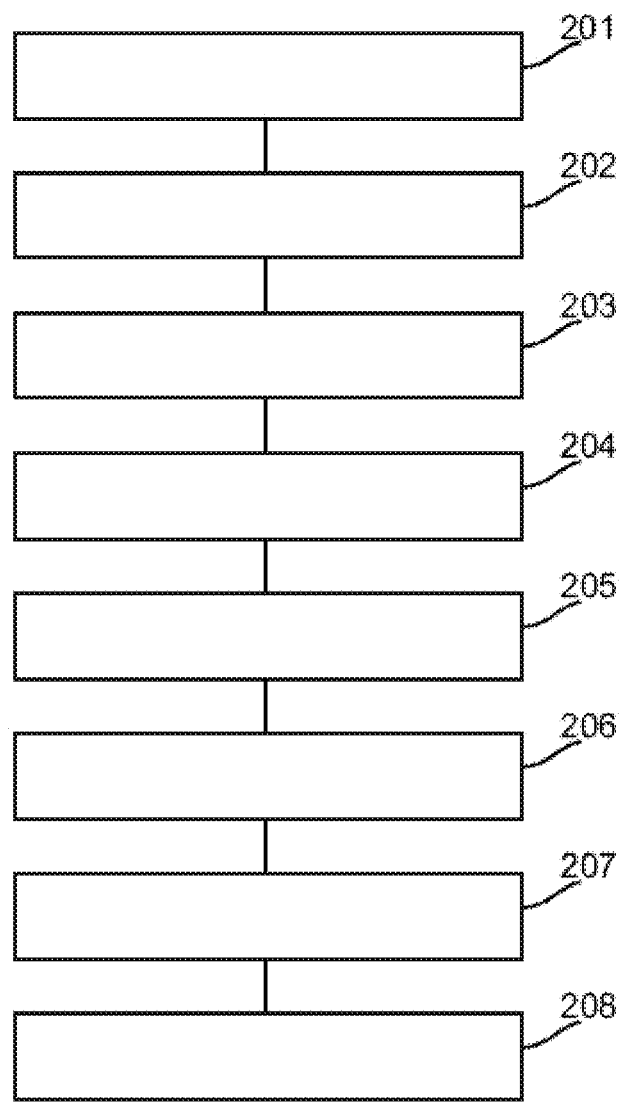
FIG. 2 illustrates a flowchart of a CEST imaging correction method in another embodiment of the present disclosure.

FIG. 2 is a flowchart of a CEST imaging correction method in another embodiment of the present disclosure, the method comprising the following steps:

Step 201: Pre-obtain the B0 map for describing the frequency deviation $\gamma \Delta B0(n)$ of the water resonance frequency of each voxel in an imaging area relative to the corresponding water resonance frequency of the main magnetic field, and the B1 map for describing the conversion coefficient B1map(n) between the real saturation B1 field intensity of each voxel in an imaging area and the system B1 field intensity.

The collection of the B0 map and the B1 map is a mature technology.

n represents the $n^{th}$ voxel in an imaging area, n is a positive integer, $1 \leq n \leq N$, and N is the total number of voxels in an imaging area.

The system B1 field intensity is the intensity of the pre-saturated RF pulse used for collecting the CEST image.

Step 202: Preset a target saturation frequency $f_{target}$ and a target saturation B1 field intensity $B1^{target}$, and set the number of times CEST images are collected and the frequency and intensity of the pre-saturated RF pulse used each time a CEST image is collected.

If the values of the offset frequency $f_{target}$ and the intensity $B1_{target}$ of each voxel in an imaging area after pre-saturation need to be measured, then the target saturation frequency is $f_{target}$, and the target saturation B1 field intensity is $B1_{target}$.

Usually, $f_{target}$ is the resonance frequency of the solute pool or the contralateral frequency of the resonance frequency. However, because fitting is required or the concentrations of a plurality of solute pools need to be measured sometimes, a plurality of $f_{target}$ or/and a plurality of $B1_{target}$ will be set in this case.

When the frequency and intensity of the pre-saturated RF pulse adopted each time a CEST image is collected are set, for the frequency, the chemical shift frequency +f of the solute pool relative to the water pool and the contralateral frequency −f need to be set at least once, and then other frequencies are set according to a fixed or variable frequency change step δf; when the frequency of the pre-saturated RF pulse is set, the intensity of the pre-saturated RF pulse is set. For example, the target saturation B1 field intensity $B1_{target}$ is set once, and then other intensities are set according to the preset fixed or variable intensity change step δB1. When the frequency and intensity of the pre-saturated RF pulse are set, both or either of the frequency and the intensity can be changed and no restriction is placed here.

Step 203: Emit pre-saturated RF pulses having the corresponding frequencies and intensities to an imaging area according to the set frequency and intensity of the pre-saturated RF pulse used each time a CEST image is collected to obtain a plurality of CEST images.

Step 204: Perform Step 205 for each pixel point in each CEST image.

Each CEST image contains N pixel points and each pixel point corresponds to one voxel in an imaging area.

Step 205: Let the current CEST image be the $m^{th}$ collected image and the current pixel point be the $n^{th}$ pixel point in the current $m^{th}$ CEST image, then read $\gamma\Delta B0(n)$ of the $n^{th}$ voxel in an imaging area from the B0 map, read B1map(n) of the $n^{th}$ voxel in an imaging area from the B1 map, calculate the corresponding real saturation frequency $f_{real}(m,n)$ of the current $n^{th}$ pixel point according to $f_{real}(m,n)=f(m)-\gamma\Delta B0(n)$, wherein γ is the gyromagnetic ratio of a spinning nucleus, and calculate the corresponding real saturation B1 field intensity $B1_{real}(m,n)$ of the current $n^{th}$ pixel point according to $B1_{real}(m,n)=B1(m)*B1map(n)$.

f(m) is the frequency of the pre-saturated RF pulse used for collecting the $m^{th}$ CEST image, B1(m) is the intensity of the pre-saturated RF pulse used for collecting the $m^{th}$ CEST image, m and n are positive integers, 1≤m≤M, 1≤n≤N, M is the total number of times CEST images are collected, and N is the total number of pixel points in each CEST image, namely, the total number of voxels in an imaging area.

Step 206: When calculating the corresponding $f_{real}(m, n)$ and $B1_{real}(m,n)$ of all pixel points in all CEST images, perform Steps 207 and 208 for each voxel in an imaging area:

Step 207: Let the current voxel be the $n^{th}$ voxel in an imaging area, then find the interpolated pixel point of the $n^{th}$ voxel in an imaging area from the $n^{th}$ pixel point in all CEST images according to $f_{target}$, $B1_{target}$, and $f_{real}(m,n)$ and $B1_{real}(m,n)$ of the $n^{th}$ pixel point in all CEST images.

In practical applications, a 2-dimensional coordinate system can be pre-established, the $n^{th}$ pixel point in all CEST images is denoted as $(f_{real}(m,n), B1_{real}(m,n))$ respectively in the coordinate system, and meanwhile $(f_{target}, B1_{target})$ is denoted in the coordinate system. In this case, there are M+1 points in the coordinate system. Then P points which are the closest to $(f_{target}, B1_{target})$ but are not in a line are found from M pixel points $(f_{real}(m,n), B1_{real}(m,n))$, and P points are interpolated pixel points. The value of P is determined by a preset interpolation algorithm. In practical applications, the value of P may vary with the interpolation algorithms adopted. Usually, the larger the value of P is, the better the interpolation effect. To achieve a good interpolation effect, it is usually required that P≥3.

Figure 3:
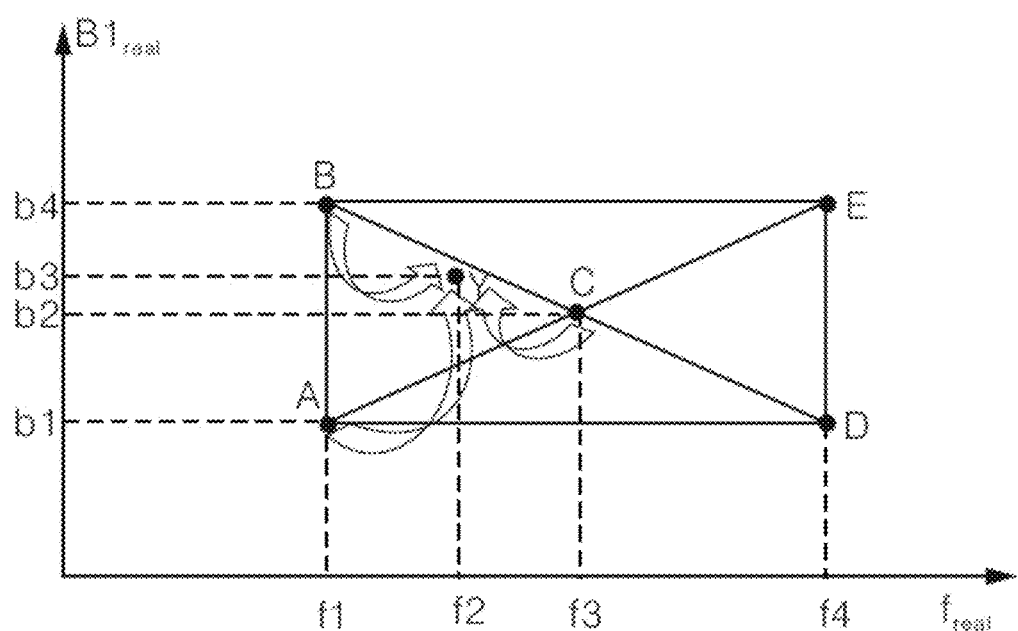
FIG. 3 illustrates a method of selecting interpolated pixel points in one embodiment of the present disclosure.

For example, when interpolated pixel points are selected for a preset interpolation algorithm, it is required that the coordinate point $(f_{target}, B1_{target})$ should be located within the triangle formed by three interpolated pixel points closest to the coordinate point $(f_{target}, B1_{target})$, as shown in FIG. 3. In this case, after all CEST images, supposing M CEST images in total are obtained, the following pre-processing can be performed for M pixel points in the same position in all CEST images:

Wherein M pixel points in the same position in all CEST images, namely, the pixel points corresponding to the same voxel in an imaging area in all CEST images, for example, are the $n^{th}$ pixel point in the first CEST image, the $n^{th}$ pixel point in the second CEST image, the $n^{th}$ pixel point in the third CEST image, . . . , the $n^{th}$ pixel point in the $(M-1)^{th}$ CEST image, and the $n^{th}$ pixel point in the $M^{th}$ CEST image, wherein 1≤n≤N.

01: Supposing that the pixel point currently processed is the $n^{th}$ pixel point in each CEST image, then obtain the 2-dimensional coordinates $(f_{real}(m,n), B1_{real}(m,n))$ of the $n^{th}$ pixel point in each CEST image, respectively. The 2-dimensional coordinates $(f_{real}(m,n), B1_{real}(m,n))$ of M $n^{th}$ pixel points are obtained in total, wherein 1≤m≤M.

02: for each $n^{th}$ pixel point, let the pixel point and every other two pixel points form a triangle according to the 2-dimensional coordinates $(f_{real}(m,n), B1_{real}(m,n))$.

As shown in FIG. 3, let M=5, then for the $n^{th}$ pixel point, the 2-dimensional coordinates $(f_{real}(m,n), B1_{real}(m,n))$ of five $n^{th}$ pixel points can be obtained, wherein 1≤m≤5 and the five $n^{th}$ pixel points correspond to A, B, C, D and E, respectively in FIG. 3, wherein $f1=f_{target}-\delta f-\gamma\Delta B0(n)$, $f3=f_{target}-\gamma\Delta B0(n)$, $f4=f_{target}+\delta f-\gamma\Delta B0(n)$, $b1=(B1_{target}-\delta B1)*B1map(n)$, $b2=B1_{target}*B1map(n)$, $b4=(B1_{target}+\delta B1)*B1map(n)$, and the five points can divide the plane into four triangles.

Then, in Step 208, when an interpolation calculation needs to be performed, the triangle which the point $(f_{target}, B1_{target})$ is closest to is found according to the coordinates $(f_{real}(m,n), B1_{real}(m,n))$ of three vertexes of each triangle, and the pixel values of the three vertexes of the triangle in the CEST image are used for an interpolation or extrapolation calculation to obtain the pixel value of the $n^{th}$ voxel in an imaging area with $f_{target}$ and $B1_{target}$. As shown in FIG. 3, point Y $(f_{target}, B1_{target})$ is closest to the triangle formed by points A, B and C, and then points A, B and C are used as interpolated pixel points for an interpolation calculation.

Figure 4:
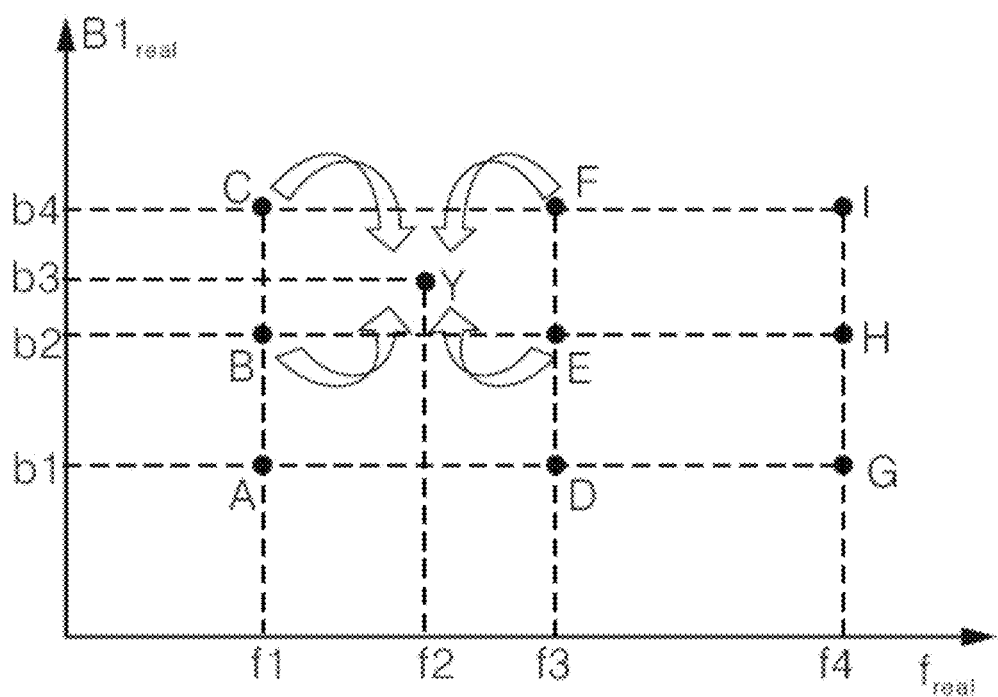
FIG. 4 illustrates the interpolation of four interpolated pixel points in one embodiment of the present disclosure.
Figure 5:
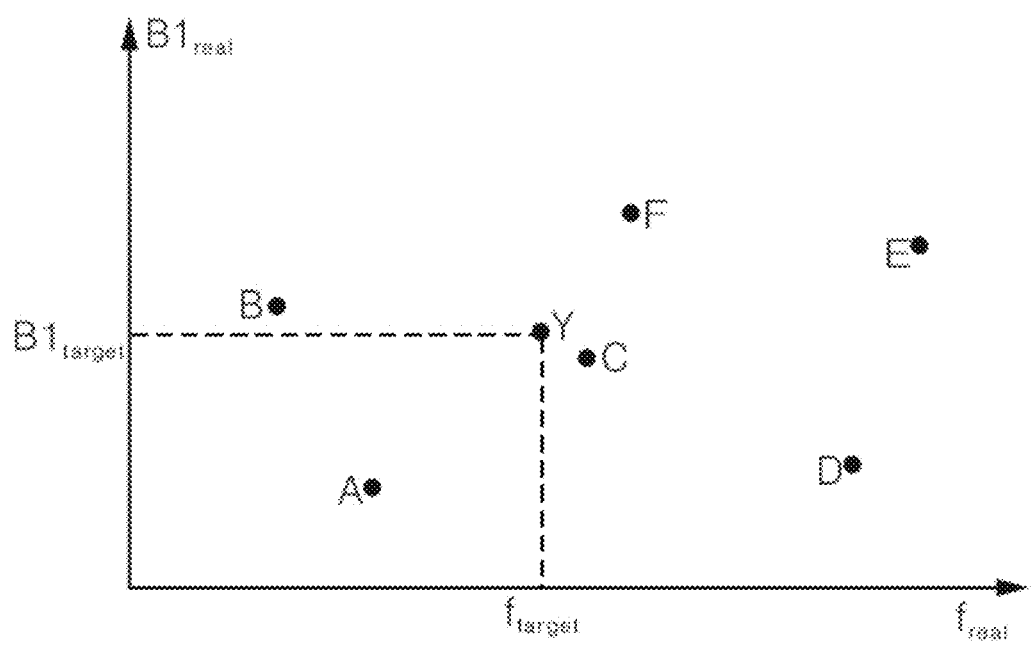
FIG. 5 illustrates the interpolation of six interpolated pixel points in one embodiment of the present disclosure.

FIG. 4 shows the interpolation of four interpolated pixel points, wherein points A, B, C, D, E, F, G, H and I are pixel points in the same position in nine CEST images, $f1=f_{target}-\delta f-\gamma\Delta B0(n)$, $f3=f_{target}-\gamma\Delta B0(n)$, $f4=f_{target}+\delta f-\gamma\Delta B0(n)$, $b1=(B1_{target}-\delta B1)*B1map(n)$, $b2=B1_{target}*B1map(n)$, $b4=(B1_{target}+\delta B1)*B1map(n)$. When an interpolation calculation needs to be performed for point Y $(f_{target}, B1_{target})$, the four points closest to point Y are B, C, E and F, and then the interpolated pixel points are points B, C, E and F. FIG. 5 shows the interpolation of six irregularly sampled interpolated pixel points $(f_{real}(m,n), B1_{real}(m,n))$, wherein points A, B, C, D, E and F are the pixel points in the same position in six CEST images, and interpolation calculations are performed for the pixel values of the six points to obtain the pixel values of the corresponding voxel at point Y $(f_{target}, B1_{target})$.

Step 208: Use the preset interpolation algorithm to perform interpolation calculations for the pixel values of all found interpolated pixel points in the CEST image to obtain the pixel value of the $n^{th}$ voxel in an imaging area with $f_{target}$ and $B1_{target}$.

When the pixel values of all voxels (N in total) in an imaging area with $f_{target}$ and $B1_{target}$ are obtained, the corrected final CEST image is obtained.

An application example of the present disclosure is given below.

In the present example, CEST imaging is only limited to amide proton transfer (APT) imaging. It should be noted that only an example is given here and the scope of the present disclosure is not limited to APT-CEST imaging.

APT imaging is a branch of CEST imaging technology the purpose of which is to detect amide protons whose chemical shift frequency is 3.5 ppm. For APT imaging, at least three collection processes are required, and the frequencies of the RF pulses used in three collection processes are: a saturation frequency −3.5 ppm, a saturation frequency 3.5 ppm, and an unsaturation frequency. After a collection is completed, an APT-W (APT weighted) image is produced.

Because of the off-resonance effect, more data of ±3.5 ppm will usually be obtained. A common method is the six point method and the frequencies of RF pulses used during six collection processes are ±3 ppm, ±3.5 ppm and ±4 ppm.

Below, the method of simultaneously correcting the B0 field and the B1 field is compared with the method of correcting only the B0 field and the method of first correcting the B0 field and then correcting the B1 field.

1) Only the B0 field is corrected.

Figure 6:
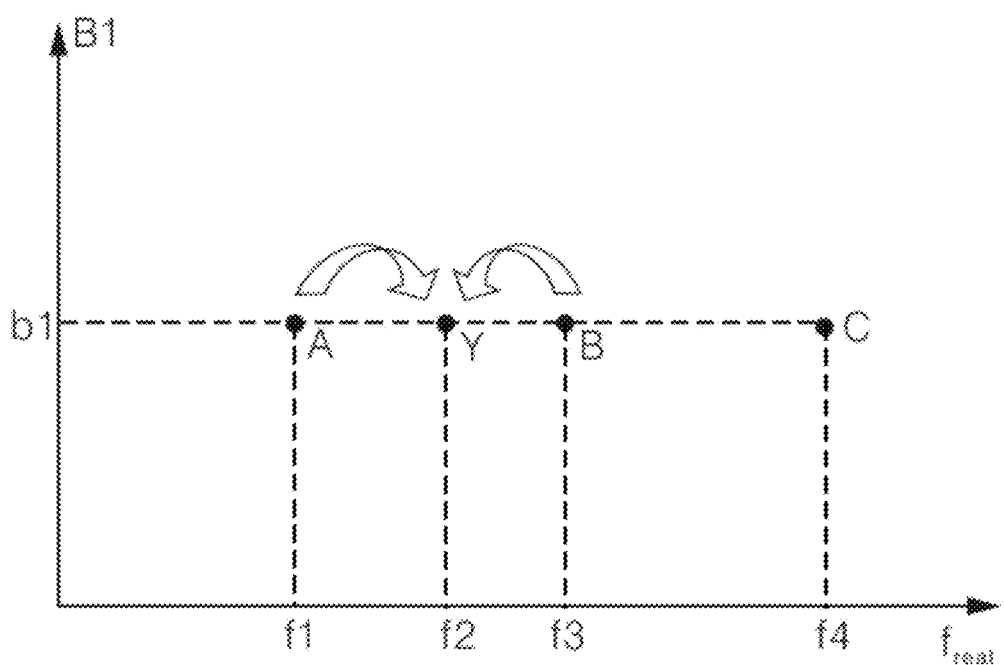
FIG. 6 illustrates an example of only a B0 field correction for CEST imaging in an embodiment of the present disclosure.

FIG. 6 shows an example of only a B0 field correction for CEST imaging. As shown in FIG. 6, a 2-dimensional coordinate system is pre-established, with the X-axis representing $f_{real}$, and the Y-axis representing B1. When a CEST imaging correction needs to be performed for the $n^{th}$ voxel in an imaging area, the $n^{th}$ voxels in the collected CEST images are respectively denoted as ($f_{real}(m,n)$,B1) in the coordinate system. Since the target saturation frequency $f_{target}$ is consistent with the resonance frequency in FIG. 6 and only a B0 field correction is performed in FIG. 6, only the distance between $f_{real}(m,n)$ and $f_{target}$ needs to be considered in this case. Therefore, FIG. 6 gives only three pixel points A, B and C which are closest to $f_{real}(m,n)$ and $f_{target}$, wherein $f1=f_{target}-\delta f-\gamma\Delta B0(n)$, $f3=f_{target}-\gamma\Delta B0(n)$, $f4=f_{target}+\delta f-\gamma\Delta B0(n)$ and $b1=B1_{target}$.

As shown in FIG. 6, two points which are the closest to point Y ($f_{target}$, $B1_{target}$) are found from three points A, B and C according to the difference between $f_{real}(m,n)$ and $f_{target}$. As shown in FIG. 6, point A ($f_{target}-\delta f-\gamma\Delta B0(n)$, $B1_{target}$) and point B ($f_{target}-\gamma\Delta B0(n)$, $B1_{target}$) are the two points closest to point Y ($f_{target}$, $B1_{target}$). Interpolation calculations are performed according to the pixel values of the two points A and B in the CEST image to obtain the pixel value of the $n^{th}$ voxel in an imaging area with $f_{target}$ and $B1_{target}$.

Figure 7:
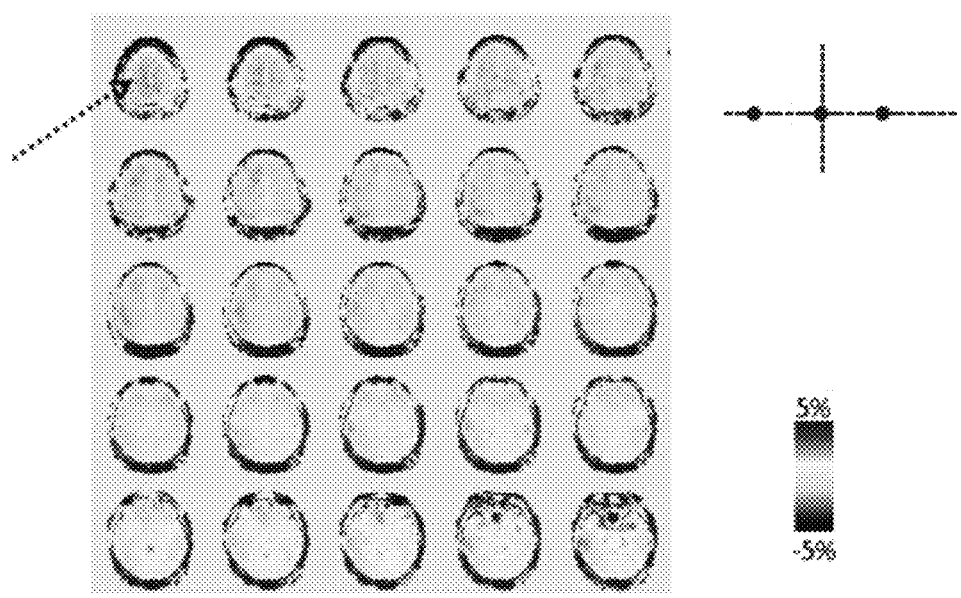
FIG. 7 illustrates an example of a correction of a brain CEST image by using the B0 field correction method for CEST imaging in an embodiment of the present disclosure.

FIG. 7 shows an example of a correction of a brain CEST image by using the B0 field correction method for CEST imaging. It can be seen that the image value of the corrected brain cross-sections arranged above is lower than the image value of the corrected brain cross-sections arranged below. For example, in FIG. 7, the image value of the cross-section indicated by an arrow is significantly lower than the image value of the cross-sections below. This is caused by the non-uniformity of the B1 field because only the B0 field is corrected but the B1 field is not corrected in this method.

2) The B0 field is first corrected and then the B1 field is corrected.

Figure 8:
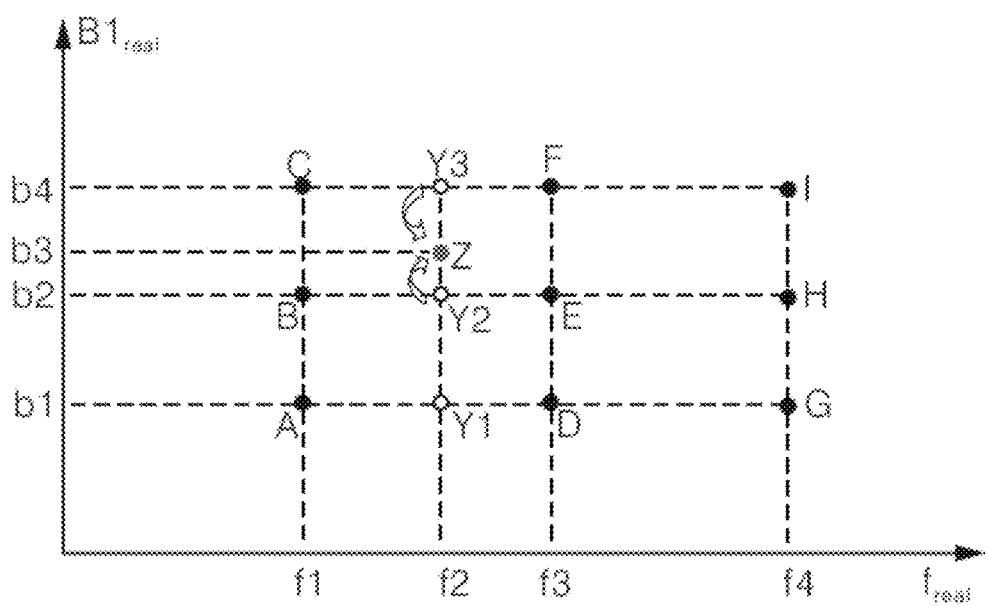
FIG. 8 illustrates an example of a B1 field correction for CEST imaging after a B0 field correction in an embodiment of the present disclosure.

In this method, the method shown in FIG. 6 is first used to correct the B0 field for CEST imaging, and then the method shown in FIG. 8 is used to correct the B1 field for CEST imaging. As shown in FIG. 8, points A, B, C, D, E, F, G, H and I are the pixel points in the same position in nine CEST images (and correspond to the $n^{th}$ voxel in an imaging area), $f1=f_{target}-\delta f-\gamma\Delta B0(n)$, $f2=f_{target}$, $f3=f_{target}-\gamma\Delta B0(n)$, $f4=f_{target}+\delta f-\gamma\Delta B0(n)$, $b1=(B1_{target}-\delta B1)*B1map(n)$, $b2=B1_{target}*B1map(n)$, $b4=(B1_{target}+\delta B1)*B1map(n)$, and point Y1 ($f_{target}$, $(B1_{target}-\delta B1)*B1map(n)$), point Y2 ($f_{target}$, $B1_{target}*B1map(n)$) and point Y3 ($f_{target}$, $(B1_{target}+\delta B1)*B1map(n)$) are points after the B0 field is corrected. When a B1 field correction needs to be performed for CEST imaging of the $n^{th}$ voxel in an imaging area, two points which are the closest to point ($f_{target}$,$B1_{target}$) are found according to the difference between $B1_{real}(m,n)$ and $B1_{target}$ from the points ($f_{target}$,$B1_{real}(m,n)$) after the B0 field correction. As shown in FIG. 8, point Y3 ($f_{target}$, $(B1_{target}+\delta B1)*B1map(n)$) and point Y2 ($f_{target}$, $B1_{target}*B1map(n)$) are the two points closest to point ($f_{target}$, $B1_{target}$), and then interpolation calculations are performed according to the interpolation calculation results of these two points after the B0 field correction to obtain the pixel value of the $n^{th}$ voxel in an imaging area with $f_{target}$ and $B1_{target}$.

It can be seen that in the method of first correcting the B0 field and then correcting the B1 field, at least four interpolation points are required and the four interpolation points form a rectangle.

Figure 9:
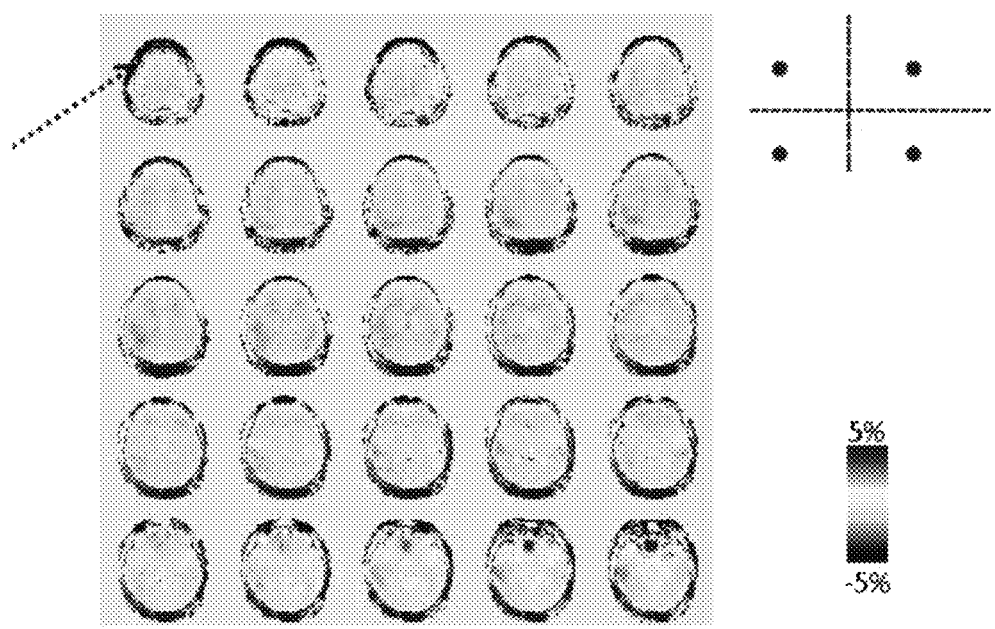
FIG. 9 illustrates an example of a correction of a brain CEST image by using the method of first correcting the B0 field and then the B1 field for CEST imaging in an embodiment of the present disclosure.

FIG. 9 shows an example of a correction of a brain CEST image by using the method of first correcting the B0 field and then the B1 field for CEST imaging. In the example, four interpolation points are used. An over-correction phenomenon can be seen. For example, the image value of the cross-section indicated by the arrow in FIG. 9 is higher than the image values of the cross-sections below. This may be caused by a small number of interpolation points.

Figure 10:
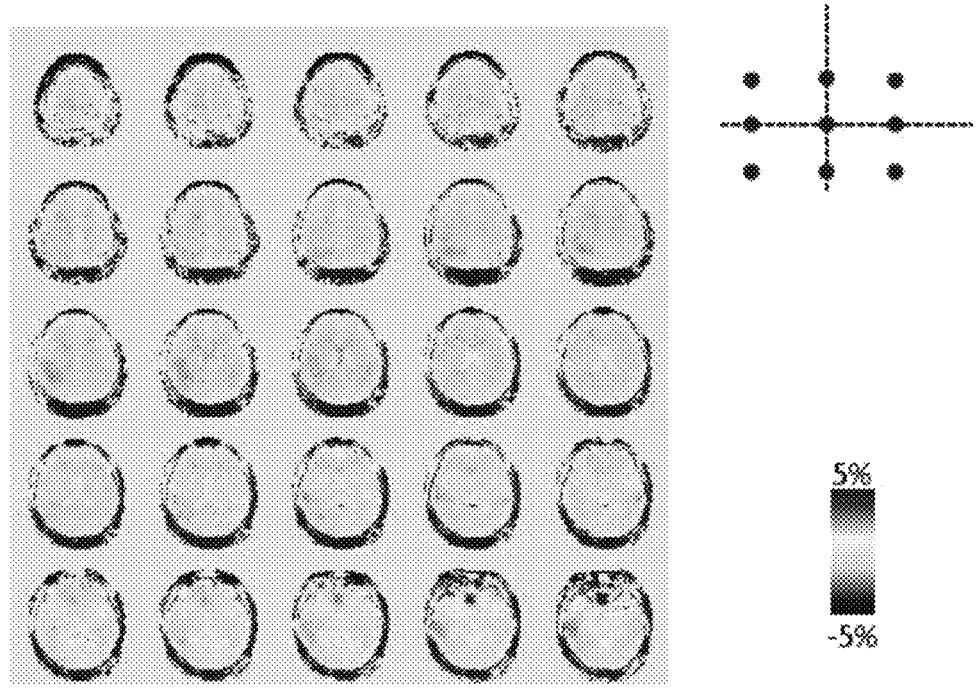
FIG. 10 illustrates another example of a correction of a brain CEST image by using the method of first correcting the B0 field and then the B1 field for CEST imaging in an embodiment of the present disclosure.

FIG. 10 shows another example of a correction of a brain CEST image by using the method of first correcting the B0 field and then the B1 field for CEST imaging. In the example, nine interpolation points are used. It can be seen that the over-corrected area around the frontal lobe of the sections arranged above is reduced, compared with FIG. 9. A good correction effect is provided in the present example, but CEST images need to be collected 18 times, which is two times larger than in the common six point method.

3) The B0 field and the B1 field are simultaneously corrected.

Figure 11:
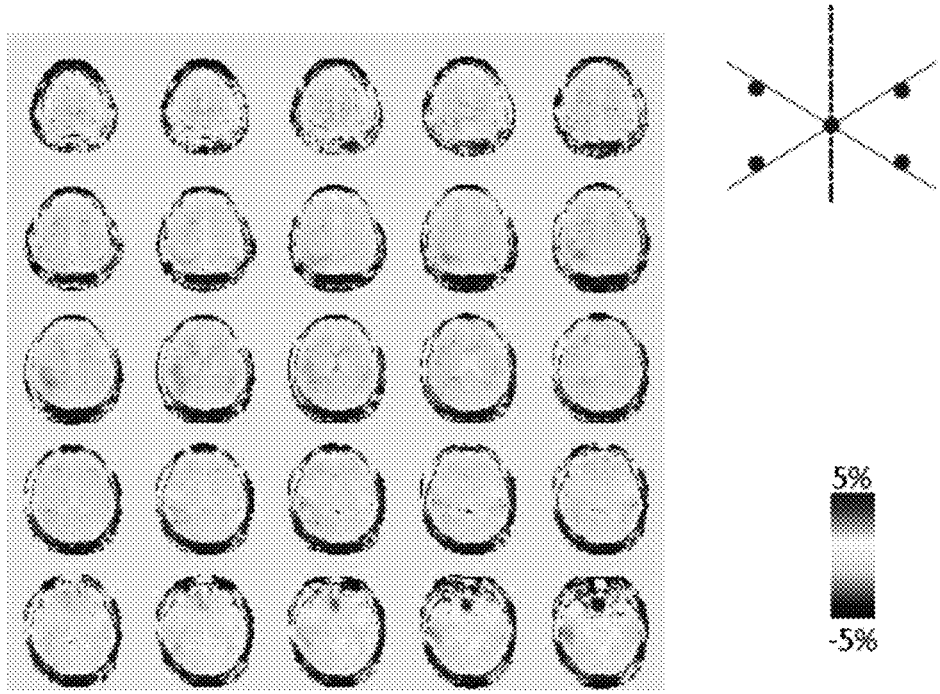
FIG. 11 illustrates an example of a correction of a brain CEST image by using the method of simultaneously correcting the B0 field and the B1 field in an embodiment of the present disclosure.

FIG. 11 shows an example of a correction of a brain CEST image by using the method of simultaneously correcting the B0 field and the B1 field. In the example, five interpolation points are used. It can be seen that the over-corrected area around the frontal lobe of the sections arranged above is reduced, compared with FIG. 9. The correction effect is similar to the one in FIG. 10, but CEST images need to be collected 18 times, which is twice larger than in the common six point method.

Figure 12:
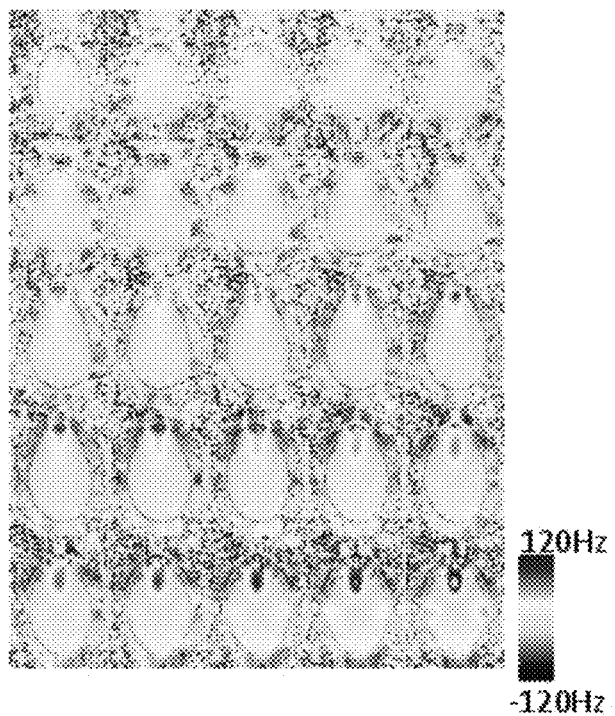
FIG. 12 shows the B0 map adopted in the examples shown in FIGS. 6 to 11 in an embodiment of the present disclosure.
Figure 13:
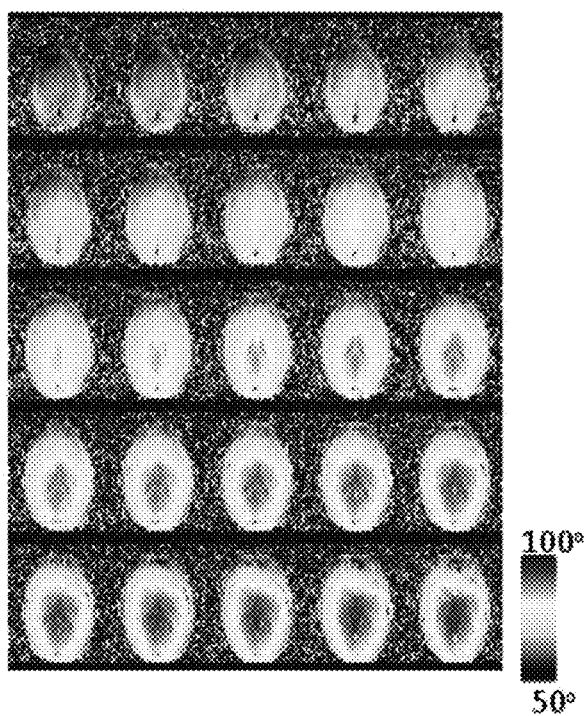
FIG. 13 shows the B1 map adopted in the examples shown in FIGS. 7 to 11 in an embodiment of the present disclosure.

FIG. 12 shows the B0 map adopted in the examples shown in FIGS. 6 to 11, and FIG. 13 shows the B1 map adopted in FIGS. 7 to 11.

The time spent in the above-mentioned examples is compared. The time starts from the collection of CEST images and ends when the final corrected image is obtained. The time spent in the example shown in FIG. 6 is 2:50 (2 minutes and 50 seconds), the time spent in the example shown in FIG. 9 is 3:10 (3 minutes and 10 seconds), the time spent in the example shown in FIG. 10 is 6:15 (6 minutes and 15 seconds), and the time spent in the example shown in FIG. 11 is 3:30 (3 minutes and 30 seconds). It can be seen that the method (the example shown in FIG. 11) provided by the present disclosure requires almost half the time to achieve the same correction effect, compared with the example shown in FIG. 10.

In addition, in the method provided by the present disclosure, there are no requirements for the positions of interpolated pixel points in a 2-dimensional coordinate system, and no special requirements for the frequency and intensity of a pre-saturated RF pulse during the collection of different CEST images. However, in the method of first correcting the B0 field and then the B1 field in FIGS. 9 and 10, all interpolated pixel points are required to form a grid pattern in a 2-dimensional coordinate system. This means that the frequency and intensity of a pre-saturated RF pulse during the collection of different CEST images must satisfy specific requirements.

Figure 14:
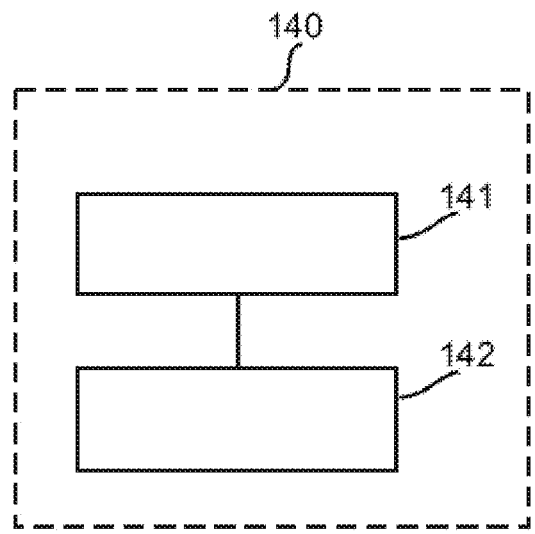
FIG. 14 shows the structure of a CEST imaging correction device in one embodiment of the present disclosure.

FIG. 14 shows the structure of a CEST imaging correction device 140 in one embodiment of the present disclosure, the device mainly comprising:

a real saturation frequency and intensity calculation module (one or more processors, processing circuitry, processors executing machine readable instructions, etc.) 141, configured, for each pixel point in each CEST image, to calculate the corresponding real saturation frequency of the pixel point according to the predetermined frequency deviation of the water resonance frequency of the corresponding voxel of the pixel point relative to the corresponding water resonance frequency of the main magnetic field and the frequency of the pre-saturated RF pulse used for collecting the CEST image, and calculate the corresponding real saturation B1 field intensity of the pixel point according to the predetermined conversion coefficient between the real saturation B1 field intensity of the corresponding voxel of the pixel point and the system B1 field intensity and the intensity of the pre-saturated RF pulse used for collecting the CEST image when a plurality of CEST images in an imaging area are collected, and an interpolation module (one or more processors, processing circuitry, processors executing machine readable instructions, etc.) 142, configured, for pixel points corresponding to the same voxel in an imaging area in all CEST images, to compare the corresponding real saturation frequency and real saturation B1 field intensity of each pixel point with the target saturation frequency and target saturation B1 field intensity, respectively, according to the corresponding real saturation frequency and target saturation B1 field intensity calculated by the real saturation frequency and intensity calculation module 141, select a plurality of pixel points as interpolated pixel points according to the comparison results, and perform interpolation calculations for the pixel values of the selected interpolated pixel points in the CEST images to obtain the pixel value of the corresponding voxel with the target saturation frequency and target saturation B1 field intensity.

In one optional embodiment, the real saturation frequency and intensity calculation module 141 calculating the real saturation frequency of the pixel point comprises calculating the real saturation frequency of the pixel point according to the following formula:

$$f_{real}(m,n)=f(m)-\gamma\Delta B0(n)$$

wherein f(m) is the frequency of the pre-saturated RF pulse used for collecting the $m^{th}$ CEST image, $\gamma$ is the gyromagnetic ratio of a spinning nucleus, $\Delta B0(n)$ is the magnetic field deviation of the corresponding voxel of the $n^{th}$ pixel point in each CEST image relative to the main magnetic field, $\gamma\Delta B0(n)$ is the frequency deviation of the corresponding water resonance frequency of the corresponding voxel of the $n^{th}$ pixel point in each CEST image relative to the main magnetic field, $f_{real}(m,n)$ is the corresponding real saturation frequency of the $n^{th}$ pixel point in the $m^{th}$ CEST image, n and m are positive integers, $1 \le m \le M$, $1 \le n \le N$, M is the total number of times CEST images are collected, and N is the total number of pixel points in each CEST image.

In one optional embodiment, the real saturation frequency and intensity calculation module 141 calculating the real saturation B1 field intensity of the pixel point comprises calculating the real saturation B1 field intensity of the pixel point according to the following formula:

$$B1_{real}(m,n)=B1(m)*B1map(n)$$

wherein B1(m) is the intensity of the pre-saturated RF pulse used for collecting the $m^{th}$ CEST image, B1map(n) is the conversion coefficient between the corresponding real saturation B1 field intensity of the $n^{th}$ pixel point in the $m^{th}$ CEST image and the system B1 field intensity, the system B1 field intensity is the intensity of the pre-saturated RF pulse used for collecting the $m^{th}$ CEST image, $B1_{real}(m,n)$ is the corresponding real saturation intensity of the $n^{th}$ pixel point in the $m^{th}$ CEST image, m and n are positive integers, $1 \le m \le M$, $1 \le n \le N$, M is the total number of times CEST images are collected, and N is the total number of pixel points in each CEST image.

In one optional embodiment, for the pixel points corresponding to the same voxel in an imaging area in all CEST images, the interpolation module 142 comparing the corresponding real saturation frequency and real saturation B1 field intensity of each pixel point with the target saturation frequency and target saturation B1 field intensity respectively according to the corresponding real saturation frequency and real saturation B1 field intensity calculated by the real saturation frequency and intensity calculation module 141 for each pixel point comprises:

pre-establishing a 2-dimensional coordinate system, with the X-axis representing $f_{real}$ and the Y-axis representing $B1_{real}$;

denoting the $n^{th}$ pixel point in all CEST images as $(f_{real}(m,n), B1_{real}(m,n))$ respectively in the coordinate system, meanwhile denoting $(f_{target}, B1_{target})$ in the coordinate system, (in this case, there are M+1 points in the coordinate system), and then finding P points which are the closest to $(f_{target}, B1_{target})$ but are not in a line from M pixel points $(f_{real}(m,n), B1_{real}(m,n))$, wherein the value of P is determined by a preset interpolation algorithm, wherein $f_{real}(m,n)$ is the corresponding real saturation frequency of the $n^{th}$ pixel point in the $m^{th}$ CEST image, $B1_{real}(m,n)$ is the corresponding real saturation intensity of the $n^{th}$ pixel point in the $m^{th}$ CEST image, $f_{target}$ is the target saturation frequency, $B1_{target}$ is the target saturation B1 field intensity, m and n are positive integers, $1 \le m \le M$, $1 \le n \le N$, M is the total number of times CEST images are collected, and N is the total number of pixel points in each CEST image.

In one optional embodiment, for the pixel points corresponding to the same voxel in an imaging area in all CEST images, the interpolation module 142 comparing the corresponding real saturation frequency and real saturation B1 field intensity of each pixel point with the target saturation frequency and target saturation B1 field intensity respectively according to the corresponding real saturation frequency and real saturation B1 field intensity calculated by the real saturation frequency and intensity calculation module 141 for each pixel point comprises:

pre-establishing a 2-dimensional coordinate system, with the X-axis representing $f_{real}$ and the Y-axis representing $B1_{real}$;

denoting the $n^{th}$ pixel point in all CEST images as $(f_{real}(m,n), B1_{real}(m,n))$ respectively in the coordinate system, and meanwhile denoting ($f_{target}$,$B1_{target}$) in the coordinate system, (in this case, there are M+1 points in the coordinate system);

for each pixel point ($f_{real}$(m,n),$B1_{real}$(m,n)), letting the pixel point and every other P−1 pixel points form a polygon of P sides according to the 2-dimensional coordinates ($f_{real}$(m,n),$B1_{real}$(m,n));

finding the polygon of P sides which is the closest to ($f_{target}$,$B1_{target}$) and using P vertexes of the polygon of P sides as interpolated pixel points;

wherein $f_{real}$(m,n) is the corresponding real saturation frequency of the $n^{th}$ pixel point in the $m^{th}$ CEST image, $B1_{real}$(m,n) is the corresponding real saturation intensity of the $n^{th}$ pixel point in the $m^{th}$ CEST image, $f_{target}$ is the target saturation frequency, $B1_{target}$ is the target saturation B1 field intensity, m and n are positive integers, 1≤m≤M, 1≤n≤N, M is the total number of times CEST images are collected, N is the total number of pixel points in each CEST image, and the value of P is determined by a preset interpolation algorithm.

Figure 15:
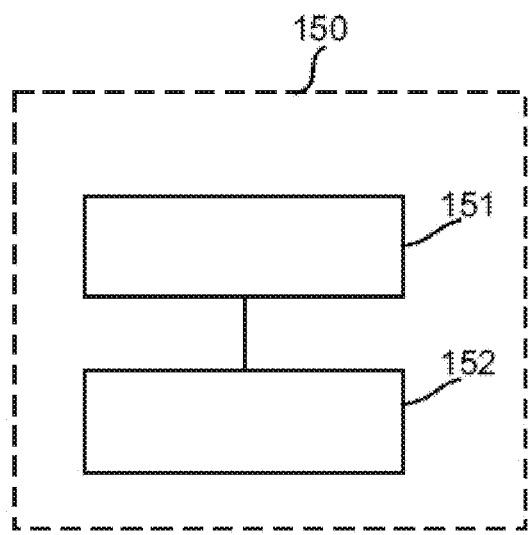
FIG. 15 shows the structure of a CEST imaging correction device in another embodiment of the present disclosure.

FIG. 15 shows the structure of a CEST imaging correction device 150 in another embodiment of the present disclosure, the device mainly comprising a processor 151 and a memory 152, wherein an application, which can be executed by the processor 151 to enable the processor 151 to perform the steps of the CEST imaging correction method, namely, Steps 101 to 103 or Steps 201 to 208, is stored in the memory 152.

A non-transitory computer-readable storage medium is provided in one embodiment of the present disclosure, a computer program is stored in the non-transitory computer-readable storage medium, and the computer program performs the steps of the CEST imaging correction method, namely, Steps 101 to 103 or Steps 201 to 208 when executed by at least one processor.

Machine-readable instructions are stored in the non-transitory computer-readable storage medium, and when the machine-readable instructions are executed by at least processor, the at least one processor will execute any of the methods described in the previous embodiments. Specifically, a system or device equipped with a non-transitory computer-readable storage medium can be provided. Software program codes which can realize the function in any of the above-mentioned embodiments are stored in the readable storage medium and the computer or one or more processors of the system or device can read out and execute the machine-readable instructions stored in the non-transitory computer-readable storage medium.

In this case, program codes read from the non-transitory computer-readable storage medium can themselves realize the function in any of the above-mentioned embodiments. Therefore, machine-readable codes and the non-transitory computer-readable storage medium where machine-readable codes are stored constitute a part of the present disclosure.

Embodiments of non-transitory computer-readable storage media include floppy disks, hard disks, magneto-optical disks, compact disks (for example, compact disks read-only memory (CD-ROM)), compact disks—recordable (CD-R), compact disks—rewritable (CD-RW), digital video disks—read only memory (DVD-ROM), digital versatile disks—random access memory (DVD-RAM), digital versatile disks—recordable (DVD-RW), digital versatile disks—rewritable (DVD+RW)), magnetic tape, non-volatile memory cards, and read-only memory (ROM). Alternatively, program codes can be downloaded from the server computer or cloud over a communication network.

"One" or "the" in the singular form in the description or claims of the present disclosure is also intended to cover the plural form, unless otherwise explicitly specified in the document.

Those skilled in the art should understand that variants and modifications can be made without departing from the essence of the present disclosure. Therefore, the scope of protection of the present disclosure should be defined by the attached claims.

It should be noted that not all steps or modules in the above-mentioned flowcharts and system structure diagrams are required, and some steps or modules can be omitted, depending on the actual requirements. The execution sequence of the steps is not fixed and may be adjusted as required. The device structures described in the above-mentioned embodiments can be physical structures or logical structures. That is to say, some modules may be realized by a physical entity, or some modules may be realized by a plurality of physical entities or may jointly be realized by some components in a plurality of self-contained devices.

The present disclosure is revealed and described in detail above in combination with the drawings and preferred embodiments. However, the present disclosure is not limited to the disclosed embodiments. On the basis of the plurality of above-mentioned embodiments, those skilled in the art will know that more embodiments of the present disclosure can be obtained by combining the code review means in the above-mentioned different embodiments, and all these embodiments should also fall within the scope of protection of the present disclosure.

What is claimed is:

1. A Chemical Exchange Saturation Transfer (CEST) imaging correction method, comprising:

collecting, via one or more processors, a plurality of CEST images in an imaging area;

for each pixel point in each one of the plurality of CEST images:

calculating a corresponding real saturation frequency of each respective pixel point according to (i) a predetermined frequency deviation of a water resonance frequency of the corresponding voxel of the pixel point relative to the corresponding water resonance frequency of a main magnetic field, and (ii) a frequency of a pre-saturated RF pulse used for collecting the CEST image, and calculating the corresponding real saturation B1 field intensity of each respective pixel point according to a predetermined conversion coefficient between (i) a real saturation B1 field intensity of the corresponding voxel of the pixel point and a system B1 field intensity, and (ii) an intensity of the pre-saturated RF pulse used for collecting the CEST image, wherein the system B1 field intensity is equal to the intensity of the pre-saturated RF pulse used for collecting the CEST image; and for pixel points corresponding to the same voxel in an imaging area in each one of the plurality of CEST images:

comparing the corresponding real saturation frequency and real saturation B1 field intensity of each respective pixel point with (i) a target saturation frequency, and (ii) a target saturation B1 field intensity, respectively;

selecting a plurality of pixel points as interpolated pixel points according to the comparison results of the real saturation frequency and real saturation B1 field intensity; and performing interpolation calculations for the pixel values of the selected interpolated pixel points in the plurality of CEST images to obtain a pixel value of the corresponding voxel having (i) the target saturation frequency, and (ii) the target saturation b1 field intensity.

2. The method as claimed in claim 1, wherein the act of calculating the corresponding real saturation frequency of each respective pixel point comprises calculating the corresponding real saturation frequency of each respective pixel point according to the following formula:

$$freal(m,n)=f(m)-\gamma\Delta B0(n), \text{ wherein:}$$

f(m) represents the frequency of the pre-saturated RF pulse used for collecting an mth CEST image,
γ represents a gyromagnetic ratio of a spinning nucleus,
ΔB0(n) represents a magnetic field deviation of the corresponding voxel of an nth pixel point in each respective CEST image relative to the main magnetic field,
γΔB0(n) represents predetermined frequency deviation of the corresponding water resonance frequency of the corresponding voxel of the nth pixel point in each respective CEST image relative to the main magnetic field,
freal(m,n) represents the corresponding real saturation frequency of the nth pixel point in each mth CEST image,
n and m represent positive integers, 1≤m≤M, 1≤n≤N,
M is the total number of times CEST images are collected, and
N is the total number of pixel points in each one of the plurality of CEST images.

3. The method as claimed in claim 1, wherein the act of calculating the corresponding real saturation B1 field intensity of each respective pixel point comprises calculating the corresponding real saturation B1 field intensity of each respective pixel point according to the following formula:

$$B1real(m,n)=B1(m)*B1map(n), \text{ wherein:}$$

B1(m) represents the intensity of the pre-saturated RF pulse used for collecting an mth CEST image,
B1map(n) represents a conversion coefficient between the corresponding real saturation B1 field intensity of the nth pixel point in the mth CEST image and the system B1 field intensity, the system B1 field intensity being the intensity of the pre-saturated RF pulse used for collecting the mth CEST image,
B1real(m,n) represents the corresponding real saturation intensity of the nth pixel point in the mth CEST image,
m and n are positive integers, 1≤m≤M, 1≤n≤N,
M represents the total number of times CEST images are collected, and
N represents the total number of pixel points in each CEST image.

4. The method as claimed in claim 1, wherein, for the pixel points corresponding to the same voxel in an imaging area in each one of the plurality of CEST images comparing the corresponding real saturation frequency and real saturation B1 field intensity of each pixel point with the target saturation frequency and target saturation B1 field intensity, respectively, and
wherein selecting a plurality of pixel points as interpolated pixel points according to the comparison results comprises:
pre-establishing a 2-dimensional coordinate system with the X-axis representing freal and the Y-axis representing B1real; and
denoting an nth pixel point in each one of the plurality of CEST images as (freal(m,n), B1real(m,n)) respectively, in the coordinate system, denoting (ftarget, B1target) in the coordinate system, and identifying P points which are the closest to (ftarget,B1target) but are not in a line from M pixel points (freal(m,n), B1real(m,n)),
wherein:
freal(m,n) represents the corresponding real saturation frequency of the nth pixel point in the mth CEST image,
B1real(m,n) represents the corresponding real saturation intensity of the nth pixel point in an mth CEST image,
ftarget represents the target saturation frequency,
B1target represents the target saturation B1 field intensity,
m and n are positive integers, 1≤m≤M, 1≤n≤N,
M represents the total number of times CEST images are collected, and
N represents a total number of pixel points in each one of the plurality of CEST images.

5. The method as claimed in claim 1, wherein, for the pixel points corresponding to the same voxel in an imaging area in each one of the plurality of CEST images, comparing the corresponding real saturation frequency and real saturation B1 field intensity of each pixel point with the target saturation frequency and target saturation B1 field intensity, respectively, and
wherein selecting a plurality of pixel points as interpolated pixel points according to the comparison results comprises:
pre-establishing a 2-dimensional coordinate system, with the X-axis representing freal and the Y-axis representing B1real;
denoting an nth pixel point in each one of the plurality of CEST images as (freal(m,n), B1real(m,n)), respectively, in the coordinate system, and denoting (ftarget, B1target) in the coordinate system;
for each pixel point (freal(m,n),B1real(m,n)), forming a polygon of P sides according to the 2-dimensional coordinates (freal(m,n),B1real(m,n)) from the pixel point and every other P−1 pixel points; and
identifying a polygon of P sides that is the closest to (ftarget,B1target) and using P vertexes of the polygon of P sides as interpolated pixel points,
wherein;
freal(m,n) represents the corresponding real saturation frequency of the nth pixel point in the mth CEST image,
B1real(m,n) represents the corresponding real saturation intensity of the nth pixel point in the mth CEST image, ftarget is the target saturation frequency,
B1target represents the target saturation B1 field intensity, m and n are positive integers, 1≤m≤M, 1≤n≤N,
M represents the total number of times CEST images are collected,
N represents the total number of pixel points in each one of the plurality of CEST images.

6. A CEST imaging correction device, comprising:
real saturation frequency and intensity calculation circuitry configured to, for each pixel point in a plurality of CEST images;
calculate a corresponding real saturation frequency of the pixel point according to (i) a predetermined frequency deviation of a water resonance frequency of the corresponding voxel of the pixel point relative to the corresponding water resonance frequency of the main magnetic field, and (ii) a frequency of a pre-saturated RF pulse used for collecting the CEST image, and calculate the corresponding real saturation B1 field intensity of the pixel point according to a predetermined conversion coefficient between (i) a real saturation B1 field intensity of the corresponding voxel of the pixel point and a system B1 field intensity, and (ii) an intensity of the pre-saturated RF pulse used for collecting the CEST image when a plurality of CEST images in an imaging area are collected, wherein the system B1 field intensity is equal to the intensity of the pre-saturated RF pulse used for collecting the CEST image; and interpolation circuitry configured to, for pixel points corresponding to the same voxel in an imaging area in each one of the plurality of CEST images:

compare the corresponding real saturation frequency and real saturation B1 field intensity of each pixel point with (i) a target saturation frequency, and (ii) a target saturation B1 field intensity, respectively, select a plurality of pixel points as interpolated pixel points according to the comparison results of the real saturation frequency and real saturation B1 field intensity, and perform interpolation calculations for the pixel values of the selected interpolated pixel points in the in the plurality of CEST images to obtain a pixel value of the corresponding voxel in having (i) the target saturation frequency, and (ii) the target saturation B1 field intensity.

7. The device as claimed in claim 6, wherein the real saturation frequency and intensity calculation circuitry is configured to calculate the real saturation frequency of the pixel point according to the following formula:

$$freal(m,n) = f(m) - \gamma \Delta B0(n), \text{ wherein:}$$

f(m) represents the frequency of the pre-saturated RF pulse used for collecting a mth CEST image, γ represents a gyromagnetic ratio of a spinning nucleus, ΔB0(n) represents a magnetic field deviation of a corresponding voxel of the nth pixel point in each one of the plurality of CEST images relative to the main magnetic field, γΔB0(n) represents a frequency deviation of the corresponding water resonance frequency of the corresponding voxel of the nth pixel point in one of the plurality of CEST images relative to the main magnetic field, freal(m,n) represents a corresponding real saturation frequency of the nth pixel point in an mth CEST image, n and m are positive integers, 1≤m≤M, 1≤n≤N, M represents the total number of times the plurality of CEST images are collected, and N represents a total number of pixel points in each one of the plurality of CEST images.

8. The device as claimed in claim 6, wherein the real saturation frequency and intensity calculation circuitry is configured to calculate the real saturation B1 field intensity of the pixel point according to the following formula:

$$B1real(m,n) = B1(m) * B1map(n), \text{ wherein:}$$

B1(m) represents the intensity of the pre-saturated RF pulse used for collecting an mth CEST image, B1 map(n) represents a conversion coefficient between the corresponding real saturation B1 field intensity of the nth pixel point in the mth CEST image and the system B1 field intensity, the system B1 field intensity comprising an intensity of the pre-saturated RF pulse used for collecting the mth CEST image, B1real(m,n) represents a corresponding real saturation intensity of an nth pixel point in an mth CEST image, m and n are positive integers, 1≤m≤M, 1≤n≤N, M represents a total number of times the plurality of CEST images are collected, and N represents a total number of pixel points in each one of the plurality of CEST images.

9. The device as claimed in claim 6, wherein for the pixel points corresponding to the same voxel in an imaging area in each one of the plurality of CEST images, the interpolation circuitry is configured to compare a corresponding real saturation frequency and real saturation B1 field intensity of each pixel point with the target saturation frequency and target saturation B1 field intensity, respectively, and select a plurality of pixel points as interpolated pixel points according to the comparison results by:

pre-establishing a 2-dimensional coordinate system, with the X-axis representing freal and the Y-axis representing B1real;

denoting an nth pixel point in each one of the plurality of CEST images as (freal(m,n), B1real(m,n)), respectively, in the coordinate system, denoting (ftarget, B1target) in the coordinate system, and identifying P points that are the closest to (ftarget,B1target) but are not in a line from M pixel points (freal(m,n), B1real (m,n)), wherein:

freal(m,n) represents a corresponding real saturation frequency of an nth pixel point in the mth CEST image, B1real(m,n) is the corresponding real saturation intensity of the nth pixel point in an mth CEST image, ftarget represents the target saturation frequency, B1target represents the target saturation B1 field intensity, m and n are positive integers, 1≤m≤M, 1≤n≤N, M represents the total number of times the plurality of CEST images are collected, and N represents a total number of pixel points in each one of the plurality of CEST images.

10. The device as claimed in claim 6, wherein for the pixel points corresponding to the same voxel in an imaging area in each one of the plurality of CEST images, the interpolation circuitry is configured to compare the corresponding real saturation frequency and real saturation B1 field intensity of each pixel point with the target saturation frequency and target saturation B1 field intensity, respectively, and select a plurality of pixel points as interpolated pixel points by:

pre-establishing a 2-dimensional coordinate system, with the X-axis representing freal and the Y-axis representing B1real;

denoting an nth pixel point each one of the plurality of CEST images as (freal(m,n), B1real(m,n)), respectively, in the coordinate system, and denoting (ftarget, B1target) in the coordinate system;

for each pixel point (freal(m,n),B1real(m,n)), forming a polygon of P sides according to the 2-dimensional coordinates (freal(m,n),B1real(m,n)) from the pixel point and every other P−1 pixel points;

finding the polygon of P sides which is the closest to (ftarget,B1target) and using P vertexes of the polygon of P sides as interpolated pixel points, wherein:

freal(m,n) represents the corresponding real saturation frequency of an nth pixel point in an mth CEST image, B1real(m,n) represents the corresponding real saturation intensity of the nth pixel point in the mth CEST image, ftarget represents the target saturation frequency, B1target represents the target saturation B1 field intensity, m and n are positive integers, $1 \leq m \leq M$, $1 \leq n \leq N$, M represents the total number of times the plurality of CEST images are collected, and N represents the total number of pixel points in each one of the plurality of CEST images.

11. A readable storage medium having computer-readable instructions stored thereon that, when executed by one or more processors associated with a Chemical Exchange Saturation Transfer (CEST) imaging correction device, cause the CEST imaging device to perform CEST imaging correction by:

collecting a plurality of CEST images in an imaging area;

for each pixel point in each one of the plurality of CEST images:

calculating a corresponding real saturation frequency of each respective pixel point according to (i) a predetermined frequency deviation of a water resonance frequency of the corresponding voxel of the pixel point relative to the corresponding water resonance frequency of a main magnetic field, and (ii) a frequency of a pre-saturated RF pulse used for collecting the CEST image, and calculating the corresponding real saturation B1 field intensity of each respective pixel point according to a predetermined conversion coefficient between (i) a real saturation B1 field intensity of the corresponding voxel of the pixel point and a system B1 field intensity, and (ii) an intensity of the pre-saturated RF pulse used for collecting the CEST image, wherein the system B1 field intensity is equal to the intensity of the pre-saturated RF pulse used for collecting the CEST image; and for pixel points corresponding to the same voxel in an imaging area in each one of the plurality of CEST images:

comparing the corresponding real saturation frequency and real saturation B1 field intensity of each respective pixel point with (i) a target saturation frequency, and (ii) a target saturation B1 field intensity, respectively;

selecting a plurality of pixel points as interpolated pixel points according to the comparison results of the real saturation frequency and real saturation B1 field intensity; and performing interpolation calculations for the pixel values of the selected interpolated pixel points in the plurality of CEST images to obtain a pixel value of the corresponding voxel having (i) the target saturation frequency, and (ii) the target saturation B1 field intensity.

* * * * *